US008432166B2

(12) United States Patent
Worters et al.

(10) Patent No.: US 8,432,166 B2
(45) Date of Patent: Apr. 30, 2013

(54) BALANCED STEADY-STATE FREE-PRECESSION TRANSIENT IMAGING USING VARIABLE FLIP ANGLES FOR A PREDEFINED SIGNAL PROFILE

(75) Inventors: Pauline W. Worters, Menlo Park, CA (US); Brian A. Hargreaves, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 245 days.

(21) Appl. No.: 12/660,676

(22) Filed: Mar. 1, 2010

(65) Prior Publication Data
US 2011/0210732 A1 Sep. 1, 2011

(51) Int. Cl.
*G01V 3/00* (2006.01)
(52) U.S. Cl.
USPC ......................................... 324/318
(58) Field of Classification Search ........... 324/300–322
See application file for complete search history.

(56) References Cited

U.S. PATENT DOCUMENTS

| 4,710,718 | A | * | 12/1987 | Shaka | 324/309 |
| 5,307,014 | A | | 4/1994 | Laub | |
| 6,452,387 | B1 | | 9/2002 | Hargreaves | |
| 6,462,545 | B1 | | 10/2002 | Busse | |
| 6,618,609 | B2 | | 9/2003 | Liu | |
| 7,208,950 | B2 | | 4/2007 | Deimling | |
| 7,227,356 | B1 | * | 6/2007 | Hariharan et al. | 324/307 |
| 7,405,566 | B2 | | 7/2008 | Asano | |
| 2005/0148858 | A1 | * | 7/2005 | Hargreaves | 600/410 |
| 2010/0127703 | A1 | * | 5/2010 | Sung et al. | 324/309 |

OTHER PUBLICATIONS

Le Roux, Simplified model and stabilization of SSFP sequences, Journal of Magnetic Resonance, 163:23-37, 2003.*
Calculation of Flip Angles for Echo Trains with Predefined Amplitudes with the Extended Phase Graph (EPG)-Algorithm: Principles and Applications to Hyperecho and TRAPS Sequences, Hennig et al., Magn. Res. in Medicine 51:68-80, 2004.
Principles and applications of balanced SSFP techniques, Scheffler et al. Eur. Radiol. 13:2409-2418, 2003.
On the Transient Phase of Balanced SSFP Sequences, Scheffler, Magn. Res. in Medicine 49:781-783, 2003.
Improved SNR in lnear reordered 2D bSSFP imaging using variable flip angles, Paul et al., Magn. Res. Imaging 27:933-941, 2009.

(Continued)

*Primary Examiner* — Melissa Koval
*Assistant Examiner* — Daniel Miller
(74) *Attorney, Agent, or Firm* — Lumen Patent Firm

(57) ABSTRACT

A magnetic resonance imaging system or method is provided including a balanced steady-state free-precession transient imaging (transient bSSFP) device capable of increasing the overall signal during transient bSSFP acquisition by fully or better utilization of the magnetization through variable RF flip angles. The transient bSSFP device is capable of generating a series of echoes with a desired transverse magnetization profile $M_T$. It is further capable of generating RF pulses each having a distinct RF flip angle for each of the echoes in the series of echoes. The transient bSSFP device is coupled to a computer capable of calculating the distinct RF flip angle for the nth echo in the series of echoes. The computer calculation utilizes a program encoding an analytical inversion of the Bloch equation. Once the RF flip angle is calculated, it is used by the transient bSSFP device in the generation of the nth echo.

20 Claims, 8 Drawing Sheets

OTHER PUBLICATIONS

Matrix Treatment of Nuclear Induction, Jaynes, Physical Review, 98(4):1099-1105, 1955.

Characterization and Reduction of the Transient Response in Steady-State MR Imaging, Hargreaves et al., Magn. Res. in Medicine 46:149-158, 2001.

Multiecho Sequences with Variable Refocusing Flip Angles: Optimization of Signal Behavior using Smooth Transitions Pseudo Steady States (TRAPS), Hennig et al., Magn. Res. in Medicine 49:527-535, 2003.

The Sensitivity of Low Flip Angle RARE Imaging, Alsop, Magn. Res. in Medicine 37:178-184, 1997.

Shaping of Signal Response during the Approach to Steady State in Three-Dimensional Magnetization-Prepared Rapid Gradient-Echo Imaging Using Variable Flip Angles, Mugler, Magn. Res. in Medicine 28:165-185, 1992.

Variable-Angle Uniform Signal Excitation (VUSE) for Three-Dimensional Time-of-Flight MR Angiography, Priatna et al., Journal Magn. Res. Imaging 4:421-427, 1995.

Improved Signal in "Snapshot" Flash by Variable Flip Angles, Stehling, Magn. Res. Imaging 10:165-167, 1992.

Mutliple-Readout Selective Inversion Recovery Angiography, Wang et al., Magn. Res. in Medicine 17:244-251, 1991.

* cited by examiner

FIG. 3a
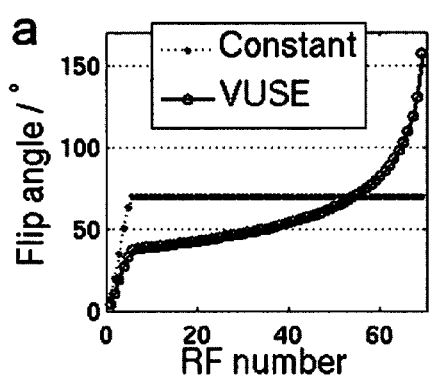
FIG. 3b
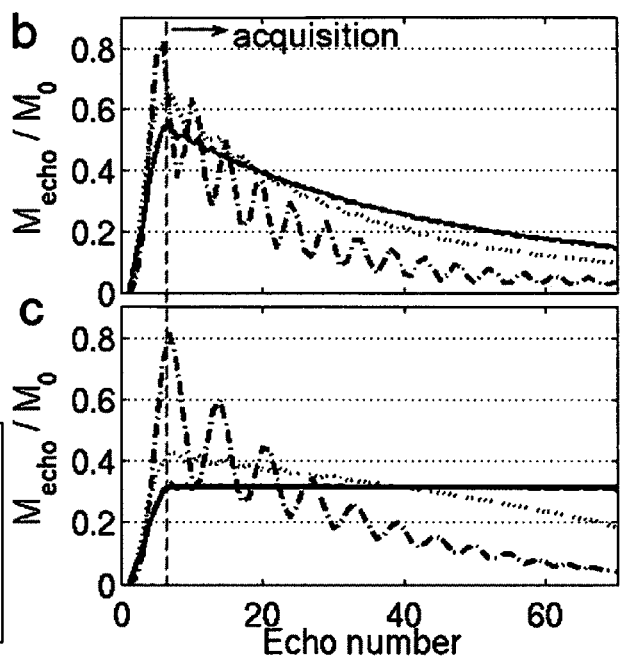
FIG. 3c

FIG. 4a
FIG. 4b
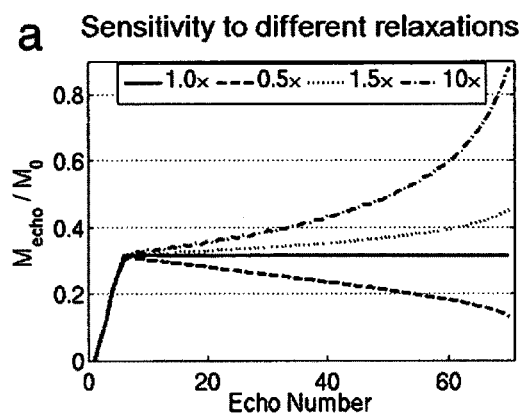
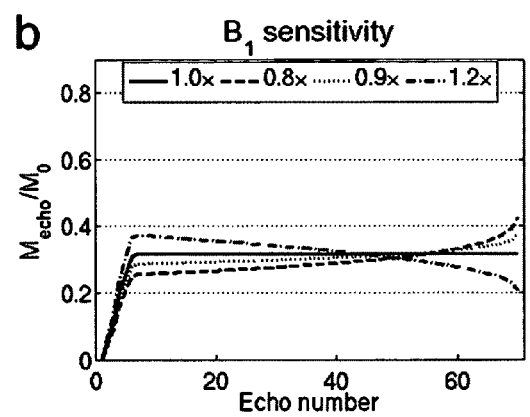

FIG. 6a
FIG. 6b
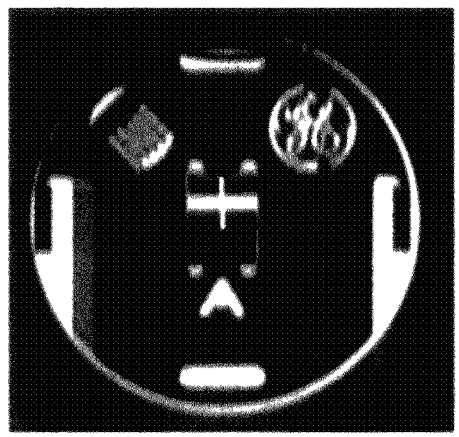
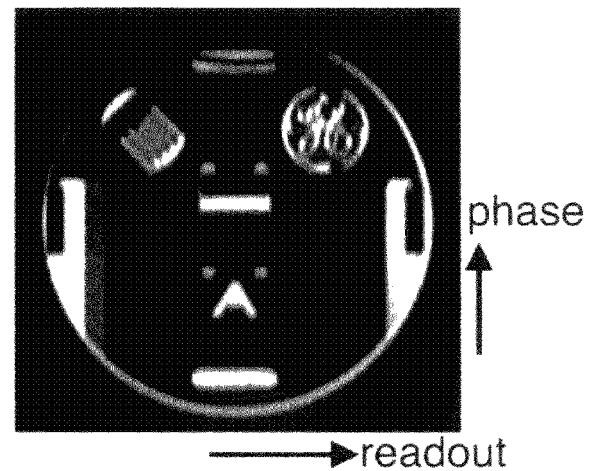
FIG. 6c  Profile Plot
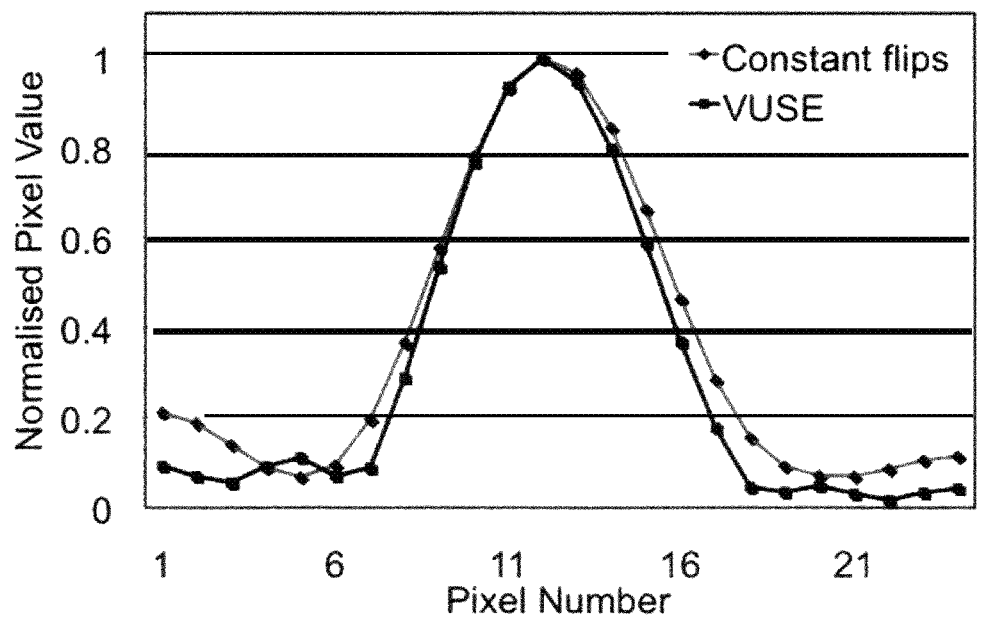

US 8,432,166 B2

BALANCED STEADY-STATE FREE-PRECESSION TRANSIENT IMAGING USING VARIABLE FLIP ANGLES FOR A PREDEFINED SIGNAL PROFILE

STATEMENT OF GOVERNMENT SPONSORED SUPPORT

This invention was made with Government support under contract HL075803, EB009055, HL039297 and RR009784 awarded by National Institutes of Health (NIH). The Government has certain rights in this invention.

BACKGROUND OF THE INVENTION

Balanced steady-state free-precession (bSSFP) is a popular magnetic resonance (MR) imaging technique (e.g., cardiac imaging, angiography) due to its high signal, speed and desirable flow properties. In bSSFP, a lot of research has been devoted to catalyzation and the steady state. Catalyzation in bSSFP includes one or more dummy RF acquisitions, which are applied before image acquisition. There are two primary reasons for catalyzing the magnetization to the steady state, which are to reduce signal oscillations and to achieve a level signal intensity to during acquisition. However, in many cases, acquisition is intermittent due to timing constraints of physiological gating or use of contrast preparation mechanisms. As a result, the steady state is never reached and acquisition only occurs in the transient stage. The acquisition is referred to as being broken up into "acquisition blocks". In certain cases, full (or equilibrium) magnetization is present at the start of each acquisition block, e.g., inflow-based angiography, allowing for increased signal in the image. The present invention focuses on techniques to increase the overall signal in a transient bSSFP acquisition by fully or better utilizing the magnetization, rather than allowing the magnetization to approach steady state.

SUMMARY OF THE INVENTION

The present invention provides a magnetic resonance imaging system including a balanced steady-state free-precession transient imaging (transient bSSFP) device capable of increasing the overall signal during transient bSSFP acquisition by full or better utilization of the magnetization through variable RF flip angles. The transient bSSFP device is capable of generating a series of echoes with a desired transverse magnetization profile $M_T$. It is further capable of generating RF pulses each having a distinct RF flip angle for each of the echoes in the series of echoes.

The transient bSSFP device is coupled to a computer capable of calculating the distinct RF flip angle for the nth echo in the series of echoes. In a preferred embodiment, the computer calculation utilizes a program encoding an analytical inversion of the Bloch equation. Once the RF flip angle is calculated, the transient bSSFP device uses it in the generation of the nth echo.

Inputs for this calculation are the preceding magnetization $M(n-1)$ and the desired transverse magnetization $M_T(n)$ such that the desired magnetization profile $M_T$ is achieved in the nth echo. Additional inputs could be the longitudinal relaxation constant, the transverse relaxation constant, and the time between RF pulses. The longitudinal relaxation constant and the transverse relaxation constant could be defined for one or more MRI species (e.g., blood, muscle tissue, fat, cerebro-spinal fluid). In addition, one could also define the desired transverse magnetization profile $M_T$ for one or more MRI species.

The preceding magnetization $M(n-1)$ could include the preceding transverse magnetization $M_T(n-1)$, the preceding longitudinal magnetization $M_L(n-1)$ or a combination thereof. The desired magnetization profile $M_T$ could be a uniform desired magnetization profile $M_T$, a ramped or windowed desired magnetization profile $M_T$, or an arbitrary desired magnetization profile $M_T$.

The calculation of RF flip angle is combined with one of several catalyzation schemes to minimize signal oscillations. Examples of possible catalyzation schemes are the Kaiser-windowed ramp, linear ramp and alpha/2-TR/2 single RF pulse, or the like or applicable. The maximum of the RF flip angle in the calculation of the RF flip angle could be limited to take into account SAR limitations. It could also be limited to avoid $B_1$ sensitivity effects. The calculation could further include techniques to optimize for residual magnetization when the blocks of imaging echoes are periodic with a known overall repetition rate.

The invention could be implemented as a system, method or computer-implemented method or program. The invention could be useful in applications such as inflow-based angiography and magnetization-prepared acquisitions.

BRIEF DESCRIPTION OF THE DRAWINGS

FIGS. 3a-c show according to an embodiment the present invention echo amplitudes from simulations of on- and off-resonant spins for (b) constant flip angle bSSFP and (c) VUSE bSSFP ($\Delta f$=off-resonant frequency). A flat echo profile is achieved in VUSE on-resonance. The flip angle schemes used are shown in (a). Both acquisitions have comparable oscillations off-resonance owing to the Kaiser-ramp catalyzation (initial five RF pulses).

FIGS. 4a-b show according to an embodiment of the present invention that uses the same flip angle scheme shown in FIG. 3a. Echo amplitudes were simulated for (4a) three other species with different $T_1$ and $T_2$ factors and (4b) at various $B_1$ scaling factors. The sensitivity to these factors does not cause oscillations, but instead results in smooth modulation of k-space weighting.

FIGS. 6a-c show according to an embodiment of the present invention images of the slice used to plot a line profile for assessing the effective spatial resolution in a linear sequential acquisition using (6a) constant flip angles and (6b) VUSE. (6c) Measured normalized line profile plots (from the vertical line in the middle of (6a)) demonstrate an increased apparent spatial resolution using VUSE.

DETAILED DESCRIPTION

Figure 1:
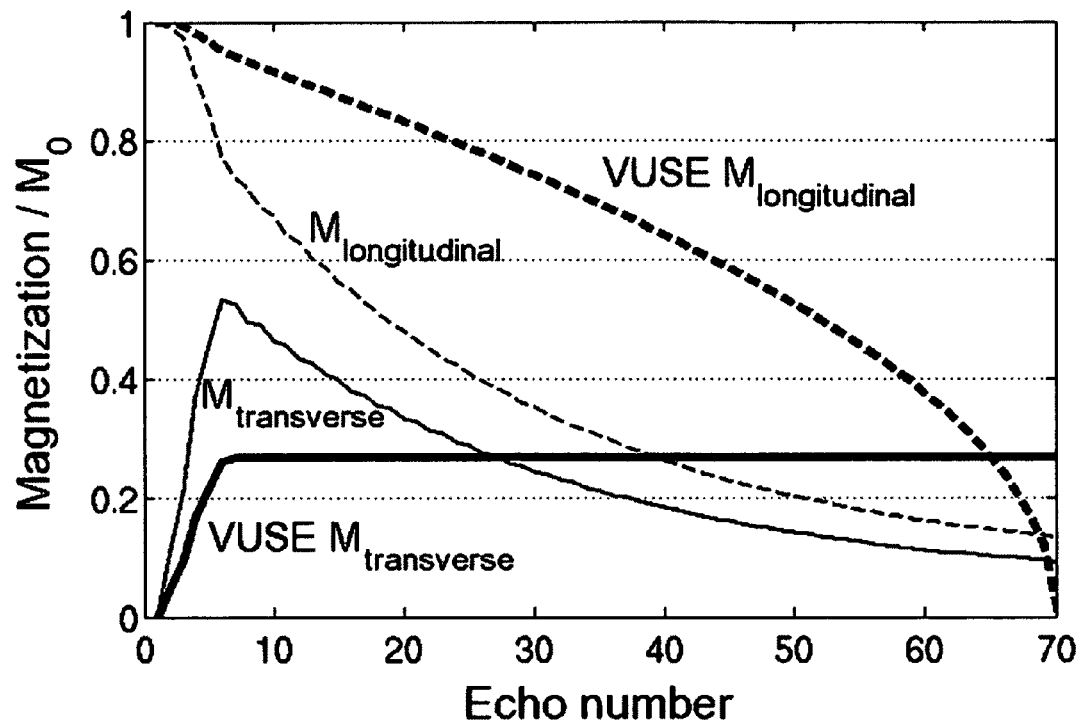
FIG. 1 shows according to an embodiment of the invention that in a regular bSSFP acquisition that occurs intermittently, the magnetization ($M_{transverse}$ and $M_{longitudinal}$) never reaches steady state. A temporally uniform echo signal (VUSE $M_{transverse}$, bold solid line) can be achieved by calculating a flip angle series that uses up most or all of $M_{longitudinal}$ by the end of the acquisition block.

According to the invention, a better or full utilization includes: (1) using a series of variable flip angles to convert all of the longitudinal magnetization to transverse magnetization, while (2) maintaining a predefined, arbitrary signal profile shape over the acquisition block. FIG. 1 demonstrates the main idea of this invention with a specific example. A uniform signal profile shape (VUSE $M_{transverse}$) is set as a target and achieved by using a series of non-linearly increasing flip angles. The signal amplitude is maximized such that the longitudinal magnetization at the end of the acquisition block is close to zero, i.e., it is used up. The invention introduces the forward calculation of flip angles directly from desired echo amplitudes for bSSFP and is demonstrated by an analytical, closed-form expression that returns the flip angle based on the preceding and desired magnetization in bSSFP.

Although we are not targeting the steady state, an appropriate catalyzation preparation scheme is still required to minimize signal oscillations (magnitude to and phase) and associated artifacts. Stable echo amplitudes and phases are important, especially in bSSFP, to minimize imaging artifacts. Common catalyzation schemes are the $\alpha/2$-TR/2 pulse, linearly increasing ramp, and Kaiser-windowed ramp. It has been demonstrated that the Kaiser-windowed ramp is an effective scheme to minimize oscillations over a wide and controllable range. In an example of the invention, we have implemented the Kaiser ramp catalyzation with all bSSFP acquisitions to minimize off-resonance artifacts. We also used the matrix Bloch formulation to present the calculations and simulations.

In summary, this invention aims to demonstrate a method for calculating flip angles to generate echoes at predefined amplitudes in balanced SSFP. The method also can optimize the integral of the signal versus time curve for any arbitrary signal profile. We present this invention first by simulations, followed by phantom experiments and finally with volunteer imaging using an inflow-based MR angiography technique.

Theory

An algorithm is introduced to calculate flip angles to produce a prescribed shape of echo amplitudes, which can then be used iteratively to maximize the overall signal. A desired signal profile shape is defined based on an array of target echoes $M_T(n)$ over the acquisition block.

Flip Angle Calculation

Figure 2:
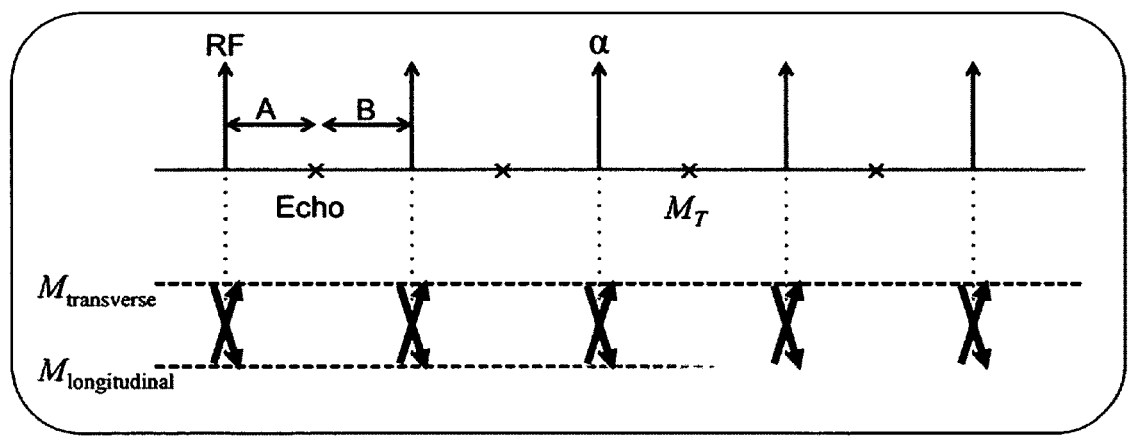
FIG. 2 shows according to an embodiment of the present invention that at each repetition, the RF pulse determines the degree to which the transverse and longitudinal magnetizations affect the following echo. The evolution of the magnetization is fully described by the Bloch equation during the intervals A and B. We can therefore calculate an appropriate RF flip angle $\alpha$ to achieve a target echo amplitude $M_T$.

The flip angle calculation is more complicated in bSSFP than in RF-spoiled gradient echo (SPGR) because both longitudinal and transverse magnetization need to be considered at each repetition. In SPGR, transverse magnetization is assumed to be zero at the end of each repetition; however in bSSFP, both transverse and longitudinal magnetizations affect the next echo signal (see FIG. 2).

The effect of relaxation before and after the echo (intervals A and B in FIG. 2) is described by the Bloch equation. The RF flip angle determines the degree to which the transverse and longitudinal magnetization affects the subsequent echo. An important development in this invention is the analytical inversion of the Bloch equation to calculate an RF flip angle such that the target echo amplitude $M_T(n)$ is achieved each repetition. In other words, the nth flip angle is a deterministic function of the preceding and desired magnetization, flip(n)=f($M_T(n-1)$, $M_T(n)$, TR, ...).

Signal Optimization Algorithm

From many possibilities, a set of optimality criteria is chosen: a series of flip angles is modified such that (1) the echo amplitudes are uniform and (2) the integral of the $M_T(n)$ versus time curve is maximized. In the optimized case, the longitudinal magnetization is close to zero at the end of the acquisition block. It is almost impossible to determine the optimized series of $M_T(n)$ analytically so an iterative method is used: a series of $M_T(n)$ is chosen and we attempt to calculate a flip angle scheme; if it is achievable, we try another higher-valued series of $M_T(n)$ otherwise we try a lower-valued series of $M_T(n)$. In this case, higher- and lower-valued series are simply higher and lower uniform signal amplitudes. Using an interval and bisection approach, the convergence is quick and takes about twelve iterations to reach an error of less than $0.0005 M_0$. The algorithm typically takes less than 50 ms to calculate a flip angle scheme for 64 echoes on a standard personal computer.

Details of the algorithm and bSSFP flip angle calculations are presented in the Appendix. There are many desirable signal profiles, but a simple case is a uniform signal amplitude, which is referred to as a "variable angle for uniform signal excitation" (VUSE). It is important to note that the choice of $M_T$ and the definition of higher- or lower-valued $M_T$ could be somewhat arbitrary. For example, $M_T$ could be linearly increasing to some maximum and the change between iterations could be the slope.

The following sections provide some illustrative examples pertaining to the invention. These methods and results sections should not be regarded as limiting to the scope of the invention.

Methods

Studies were performed using a 1.5 T MRI body scanner (GE Healthcare, Waukesha, Wis.). Informed consent was obtained from all subjects and all examinations were performed following our institution's IRB protocol. A regular 3D bSSFP pulse sequence with Kaiser-windowed ramp (five RF pulses) catalyzation was modified to perform variable flip angle calculations on-the-fly. The uniform signal profile VUSE was used as the target profile shape for all experiments hereon. The Kaiser ramp calculation was such that the RF flip angles were proportional to the cumulative sum of the Kaiser window ($\beta=2.0$), where the window ends with the first acquisition flip angle (which equals the inverse sine of the target echo amplitude). Varying flip angles were achieved by modifying the amplitude of the RF pulse (sinc pulse, with duration 0.8-1.8 ms depending on the peak flip angle required). The RF pulse duration was not modified during the acquisition.

Simulations

All simulations were performed using the numerical matrix Bloch formulation as described in the Appendix. The effects of (1) off-resonance, (2) different $T_1$ and $T_2$ and (3) $B_1$ sensitivity were investigated.

It is useful to study off-resonance by comparing the echo amplitudes from VUSE and the constant flip angle (i.e. regular bSSFP) acquisition. An acquisition block of 64 echoes was used, with a nominal $T_1/T_2=907/50$ ms (to match the relaxation values of the MRI phantom used later). The VUSE flip angle series was first calculated using the method described earlier. Next, the flip angle scheme was used to simulate the magnetization for on- and off-resonant spins; off-resonant frequencies ($\Delta f$) used were such that $\Delta f \times TR=0.05, 0.25, 0.4$, where $TR=3.8$ ms, $TE=1.9$ ms. The magnetization was compared with those obtained using a constant flip angle of 70 degrees.

Next, the magnetization for spins with different $T_1$ and $T_2$ were calculated using the same Bloch simulation and VUSE flip angle series. The same simulation parameters were used as for the on-resonant case in the previous experiment. Simulations were performed for spin species with both $T_1$ and $T_2$ multiplied by various factors (0.5, 1.5 and 10) such that the ratio of $T_1$ to $T_2$ was kept constant. The effective decay $\lambda$ of the on-resonant, transient magnetization has been shown to be a function of $T_1$, $T_2$ and flip angle $\alpha$:

$$\lambda = E_1 \cos^2(\alpha/2) + E_2 \sin^2(\alpha/2) \qquad 1$$

where $$E_{1,2} = e^{TR/T_{1,2}}.$$

Therefore, a somewhat proportional effective decay change was expected as the relaxation parameters are modified. The last simulation experiment investigates $B_1$ sensitivity. Often in MRI, the actual flip angle does not correspond to the desired flip angle due to hardware limitations, and the resulting effect is called "$B_1$ sensitivity". To simulate this behavior, proportionally higher or lower flip angles compared to the ideal case were played, assuming that the $B_1$ sensitivity is linearly dependent on the flip angle. $B_1$ variations of 0.8×, 0.9× and 1.2× the desired flip angle amplitude were tested.

MRI Phantom Acquisition

Experiments performed in this section verify the simulation results and investigate the effect of VUSE on the apparent spatial resolution. A 3D bSSFP acquisition was used with phase encoding turned off. A birdcage head coil was used to provide a uniform $B_1$ field. A ball agar phantom ($T_1/T_2=907/50$ ms) was used. The acquisition matrix (no phase encoding) was 256×64×10 (readout×echoes×slices) with each acquisition block acquiring 64 echoes. The interval between acquisition blocks was greater than $5 \times T_1$. Other parameters were: FOV=24 cm; slice thickness=2.0 mm; TR (constant flip angle=70°)=3.8 ms; TR (VUSE)=4.1 ms. The TR was higher in VUSE bSSFP to accommodate the large peak flip angle. Echoes from the center slices were measured to avoid errors from imperfect slice excitation and compared with simulations obtained earlier.

Next, a separate acquisition of a phantom with features was used to demonstrate the resolution effects of VUSE. In MRI, modulation of k-space is directly related to the apparent resolution (i.e., point spread function). A linear, sequential acquisition ordering was used with the 3D bSSFP acquisition. The phase encode (y) direction was implemented as the inner loop and all $k_y$ lines per slice (i.e., each $k_z$ plane) were acquired in a single acquisition block. This ordering was chosen so that the effects of k-space modulation could be observed in-plane. Again, the interval between acquisition blocks was greater than $5 \times T_1$ (for full magnetization recovery). Other parameters used were: matrix=256×64×16; FOV=17 cm; slice thickness=1.5 mm; TR (constant flip angle=70 degrees)=5.2 ms; TR (VUSE)=5.8 ms.

MRI Volunteer Acquisition

An inflow-sensitive, non-contrast-enhanced MRA technique was used to demonstrate the image quality improvement using VUSE bSSFP. The basic MRA pulse sequence comprised a bSSFP acquisition with two inversion recovery (IR) preparation pulses: a spatially selective IR (for background tissue and venous suppression) and a fat-selective IR. The 3D MRA acquisition was modified to acquire renal angiograms with the VUSE method, and imaging was performed in two healthy volunteers. An 8-channel phased array coil was used. Common parameters between regular bSSFP and VUSE bSSFP were: readout resolution=256; readout FOV=27-33 cm; phase FOV=17-20 cm; slice thickness=1.5-1.6 mm; TI=1.0-1.1 s; with linear sequential acquisition ordering, fat-selective IR and respiratory triggering. Each $k_z$ plane was acquired in one (phase resolution=77) or two (phase resolution=154) acquisition blocks. The time between the start of consecutive acquisition blocks was one respiratory interval, typically 2.4-4.0 seconds. The number of slices (i.e. 3D sections) acquired ranged from forty to fifty, leading to total acquisition times of two to four minutes. The volunteers were imaged with VUSE (TR=5.6 ms) and regular bSSFP (flip angle=60 degrees, 70 degrees; TR=4.6 ms, 5.1 ms). As before, the TR was higher in VUSE bSSFP to satisfy RF power deposition limits with higher flip angles used towards the end of the acquisition block.

Results Simulations

The optimized VUSE flip angle scheme and constant flip angle scheme are shown in FIG. 3c. The resulting simulated transverse magnetization is also shown for spins at on- and off-resonance (FIGS. 3a and 3b). The oscillations in the regular bSSFP and VUSE bSSFP are comparable. Note that oscillations are small near resonance, and the echo amplitudes are not significantly impacted. Further off-resonance, there could be oscillations as predicted and some loss of signal. An alternate interpretation could be given by larger "effective" flip angles, leading to faster decay as $\lambda$ (Eq. 1) becomes more T2- than T1-weighted.

FIG. 4a shows the effect of VUSE variable flip angles on species with different relaxation times. FIG. 4b shows the $B_1$ sensitivity of VUSE bSSFP. It is important to note that the effects from these sensitivities are somewhat mild in VUSE bSSFP and result in a smooth modulation of the signal profile shape. Although not shown here, regular bSSFP has an equally strong shape dependence on flip angle.

MRI Phantom Acquisition

Figure 5:
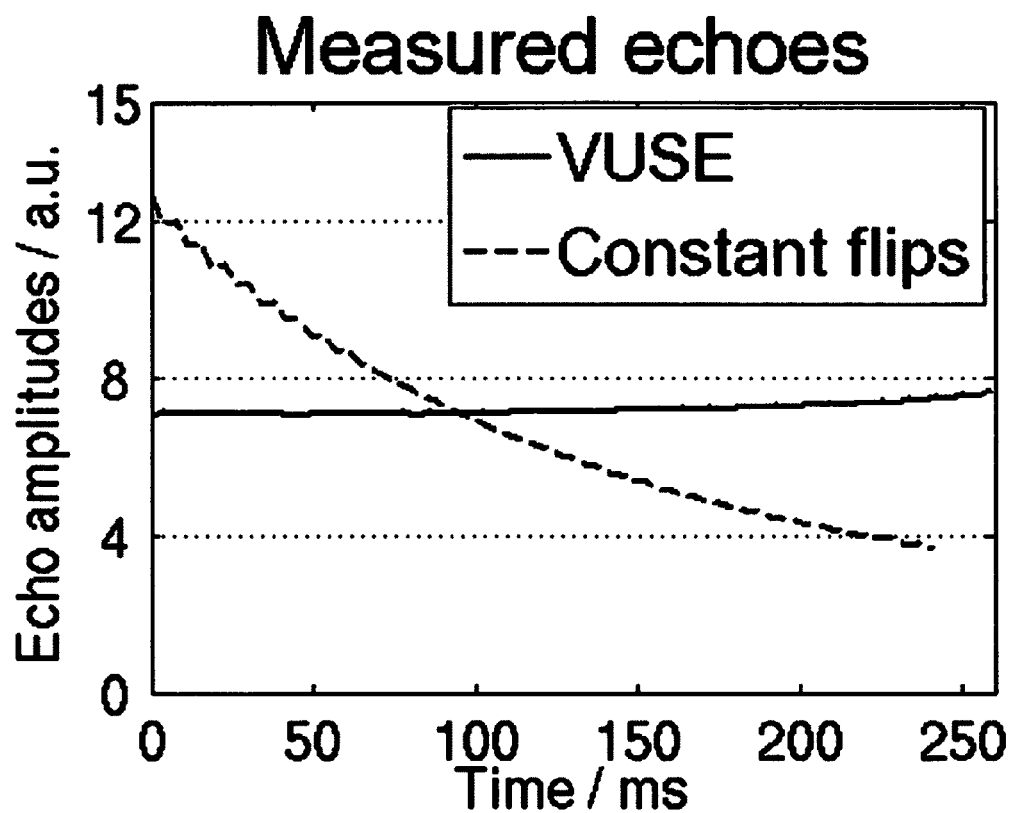
FIG. 5 shows examples according to an embodiment of the present invention plots of MRI signal (in arbitrary units) versus time for the constant (70 degrees) and VUSE flip angle schemes. The target echo profile using VUSE of this invention was a uniform signal profile. VUSE bSSFP took more time than constant flip angle bSSFP due to an increased TR (from SAR restrictions due to high flip angles used towards the end of the VUSE flip angle series).

FIG. 5 shows the expected decaying and uniform signal profiles from constant flip angle bSSFP and VUSE bSSFP. The relative amplitudes of the measured signals are similar to those of the on-resonant spins simulated in FIG. 3.

Spatial resolution differences between the constant flip angle and VUSE acquisitions using linear sequential acquisition ordering are shown in FIG. 6. The results demonstrate an improvement using VUSE bSSFP. This is intuitive since the full-width-half-maximum of the Fourier Transform of a box function is less than that of the Fourier Transform of a one-sided, decaying exponential.

MRI Volunteer Acquisition

Figure 7:
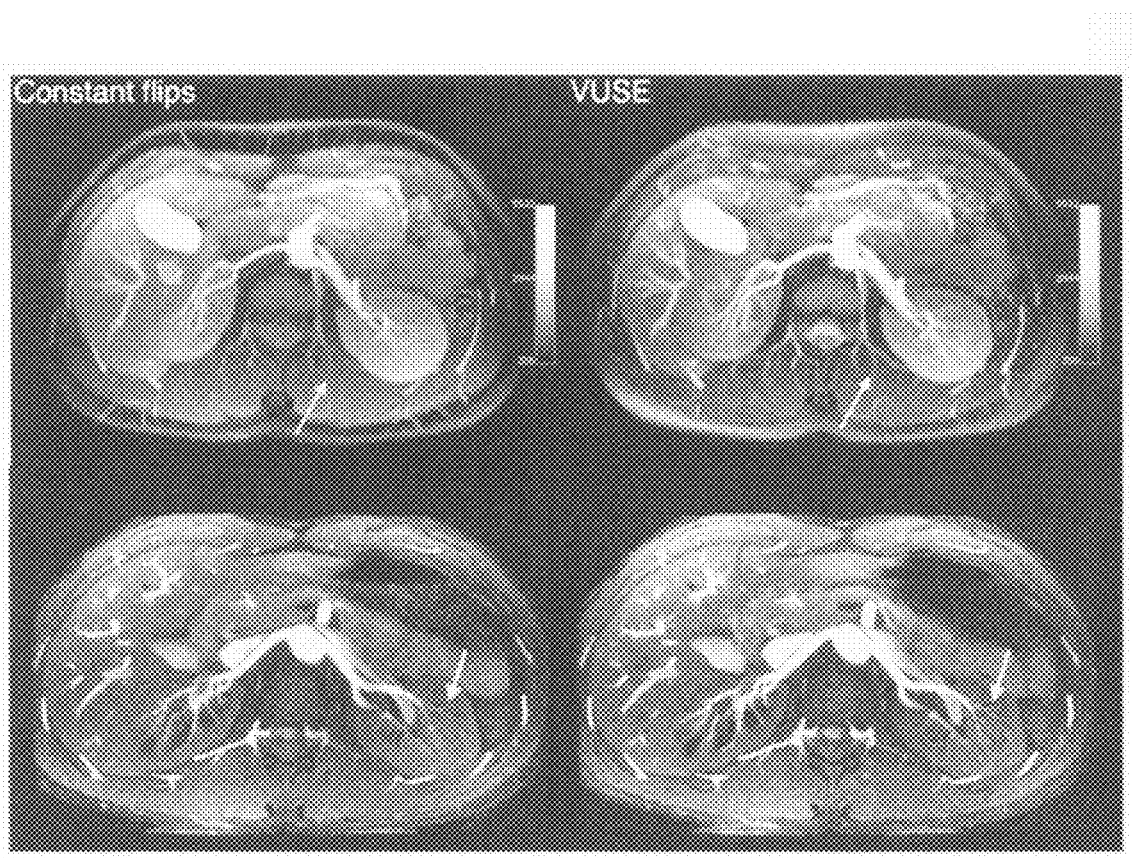
FIG. 7 shows according to an embodiment of the present invention axial MIP renal angiograms from MRA acquisitions using constant flip angle (60 degrees, upper left, and 70 degrees, lower left) and VUSE bSSFP. In the second (bottom) volunteer, each $k_z$ plane was acquired in two acquisition blocks ($k_y$ interleaved). VUSE has higher signal and improved small vessel depiction (white arrows). Each row is displayed at the same window and level.

VUSE bSSFP angiograms have higher signal and improved small vessel depiction compared to regular bSSFP angiograms (FIG. 7), which is attributed to the higher echo amplitude at k-space center and optimized integral of signal versus time. Fat suppression is poorer in one volunteer using VUSE due to increased TR resulting in sub-optimal fat nulling with the fat-selective IR; this can be remedied by reducing the length of the acquisition block, as illustrated in images from the second volunteer.

Appendix

Theory

The matrix formulation as described by Jaynes [Jaynes ET Matrix treatment of nuclear induction. Physical Review 1955; 98:1099-1105] was used to simulate Bloch dynamics in bSSFP. The spin dynamics in one TR, where it undergoes excitation, precession and relaxation, can be expressed as $$M_{n+1} = AM_n + B \quad (2)$$

where $M_n$ is the net magnetization vector at the start of the nth period, A is a 3×3 matrix and B is a 3-row vector. A and B are given in Hargreaves [Hargreaves B A, Vasanawala S S, Pauly J M, Nishimura D G. Characterization and reduction of the transient response in steady-state MR imaging. Magn Reson Med 2001; 46:149-158.] and describe the relaxation, precession and excitation processes. The vector B is disjointed from $M_n$ as it is associated with the recovery of the longitudinal magnetization.

Therefore, A and B can be expanded as $$A = CR_\alpha D \quad (3)$$

$$B = CR_\alpha E + F \quad (4)$$

where C and D are 3×3 matrices, E and F are vectors and $$R_\alpha = \begin{pmatrix} 1 & 0 & 0 \\ 0 & \cos\alpha & \sin\alpha \\ 0 & -\sin\alpha & \cos\alpha \end{pmatrix}$$

Figure 8:
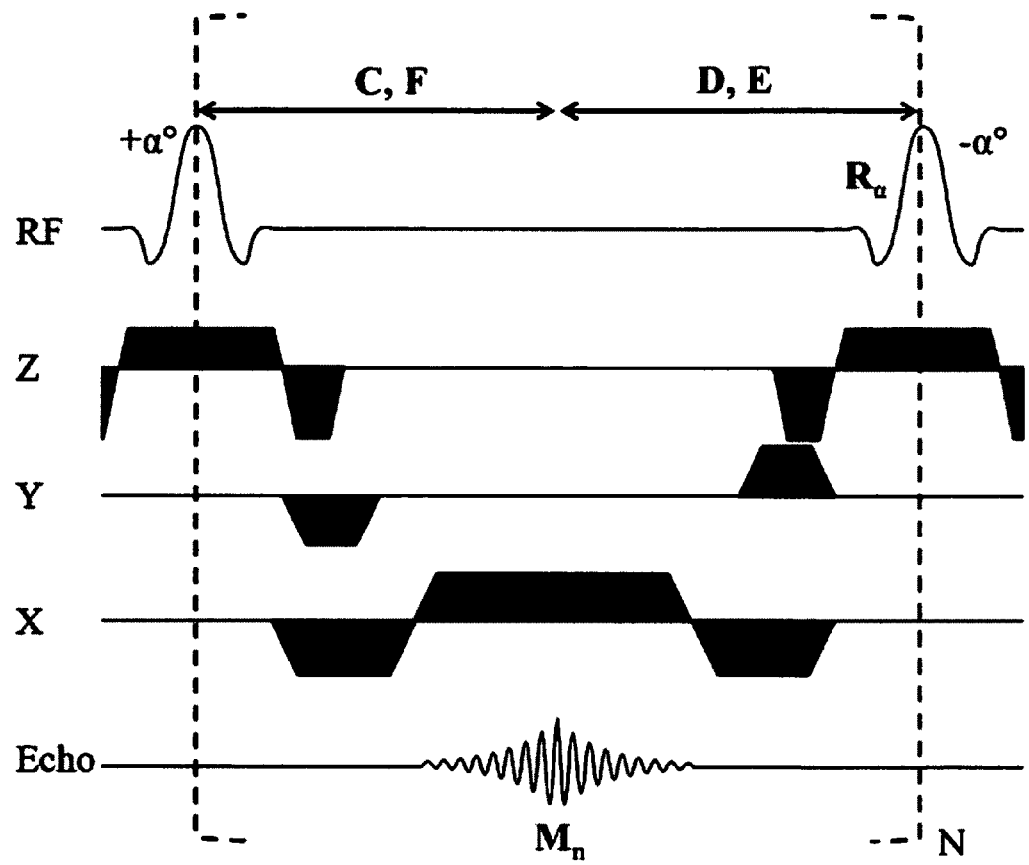
FIG. 8 shows according to an embodiment of the present invention balanced SSFP pulse sequence diagram. Matrices C, D and vectors E, F describe $T_1/T_2$ relaxation of the magnetization during the periods indicated. C and D also describe precession of the magnetization that has non-zero components at off-resonance.

FIG. 8 illustrates the parts of the pulse sequence which are effected by C, D, E, F and $R_\alpha$.

We will use an RF excitation axis along ±y such that the echoes are generated along the x axis, i.e. $M_x \neq 0$ full echo, on-resonance case, $$C = D = \begin{pmatrix} 0 & e^{-\tau/T_2} & 0 \\ -e^{-\tau/T_2} & 0 & 0 \\ 0 & 0 & e^{-\tau/T_1} \end{pmatrix} \quad (5)$$

$$E = F = \begin{pmatrix} 0 \\ 0 \\ (1 - e^{-\tau/T_1})M_0 \end{pmatrix} \quad (6)$$

where $\tau = TE = TR/2$.

The aim here is to determine a flip angle $\alpha$ such that $M_{n+1,x} = M_{n,x}$ without constraining $M_z$. We will refer to the target Mx echo amplitude as $M_T$. Now we can rewrite Eq. 2 as $$C^{-1}\left[\begin{pmatrix} M_T \\ 0 \\ M_z \end{pmatrix}_{n+1} - E\right] = R_\alpha(CM_n + E) \quad (7)$$

$$= R_\alpha G$$

The second component of the evaluated vector becomes $$C_{21}^{-1}(M_T - \overset{0}{E_1}) + C_{23}^{-1}(M_z - E_3) = G_2 \cos\alpha + G_3 \sin\alpha \quad (8)$$

where $E_1$ and $C_{23}^{-1}$ are always zero for the on-resonance case (following Eq. 5 and 6). Solving for $\alpha$ gives $$\tan\alpha = \frac{2G_2 G_3 \pm \sqrt{(2G_2 G_3)^2 - 4(H^2 - G_3^2)(H^2 - G_2^2)}}{2(H^2 - G_3^2)} \quad (9)$$

where $H = C_{21}^{-1} M_T$.

Algorithm

Starting from $M_0 = [0\ 0\ 1]^T$, a sequence of flip angles is first calculated for the Kaiser ramp dummy acquisitions. For example, in the case of five dummy acquisitions, the amplitudes of the five flip angles are determined such that the sixth flip angle is equal to $$\alpha = 2\sin^{-1}\frac{M_T}{M_z}.$$

We can then use Eq. 9 to iteratively calculate the remaining sequence of flip angles for achieving MT. In the VUSE method, it is difficult to predict what the maximum target amplitude $M_T$ is for a specific tissue species, TR and acquisition block length. For now, we will determine this amplitude using an iterative approach: an $M_T$ is chosen and we try to calculate a flip scheme; if the flip angle scheme is achievable, we try another higher-valued $M_T$, otherwise, the flip angle solution to Eq. 9 is imaginary and we bisect the interval and try again. The upper and lower bounds of the first interval of the iteration are given by $M_0$ and the steady-state amplitude.

Specifically, the steps are as follows:

1. Initialize variables. Set the target amplitude $M_T$ and test interval bounds $[M_{lower}, M_{upper}]$.

$$M_T = M_{SS} \quad (10)$$

$$M_{lower} = M_{SS} \quad (11)$$

$$M_{upper} = M_0 \quad (12)$$

where $M_0 = 1.0$ and $M_{SS} =$ steady-state amplitude as given in Scheffler [Scheffler K, Lehnhardt S. Principles and applications of balanced SSFP techniques. Eur Radiol 2003; 13:2409-2418.].

2. Calculate VUSE flip scheme. The algorithm is completed when the interval size is less than converge limit ~$0.0005 M_0$.

```
finish calcs = 0
do {
    (a) Kaiser ramp RF pulses to 2 sin⁻¹ M_T/M_z
    (b) mt not possible = 0
    for 1 : number of pulses
    {
        Calculate α for achieving M_T as in Eq.9
        if α is not real
        {
            mt not possible = 1
            break
        }
```

-continued

```
    }
(c) if mt not possible == 1
        M_upper = M_T
    else
        M_lower = M_T
(d) if (M_upper - M_lower) > converge limit
        M_T = ( M_upper - M_lower )/2
    else
        finish calcs = 1
} while (finish calcs == 0)
```

What is claimed is:

1. A magnetic resonance imaging system, comprising:
   (a) a balanced steady-state free-precession transient imaging device generating a series of echoes with for each of said echoes in said series of echoes generating a desired transverse magnetization profile $M_T$ and generating RF pulses whereby each of said RF pulses having a distinct RF flip angle for each of said echoes in said series of echoes; and
   (b) a computer coupled to said balanced steady-state free-precession transient imaging device, wherein said computer is calculating the RF flip angle for each of said echoes such that the nth echo in said series of echoes uses as input a preceding magnetization $M(n-1)$ and the desired transverse magnetization $M_T(n)$ such that said desired transverse magnetization profile $M_T$ is achieved in said nth echo, wherein said balanced steady state-free precession transient imaging device is to apply said calculated RF flip angle in the generation of said nth echo.

2. The system as set forth in claim 1, wherein said preceding magnetization $M(n-1)$ comprises a preceding transverse magnetization $M_T(n-1)$, a preceding longitudinal magnetization $M_L(n-1)$ or a combination thereof.

3. The system as set forth in claim 1, wherein said RF flip angle calculation further uses as inputs a longitudinal relaxation constant, a transverse relaxation constant, and a time between RF pulses, wherein said longitudinal relaxation constant and said transverse relaxation constant are defined for one or more MRI species.

4. The system as set forth in claim 1, wherein said desired transverse magnetization profile $M_T$ is defined for one or more MRI species.

5. The system as set forth in claim 1, wherein said RF flip angle is calculated using an analytical inversion of the Bloch equation.

6. The system as set forth in claim 1, wherein said desired magnetization profile $M_T$ is a uniform desired transverse magnetization profile $M_T$, a windowed desired transverse magnetization profile $M_T$, or an arbitrary desired transverse magnetization profile $M_T$.

7. The system as set forth in claim 1, wherein said calculation of said RF flip angle is combined with a catalyzation process to minimize signal oscillations.

8. The system as set forth in claim 1, wherein the maximum of said RF flip angle in said calculation of said RF flip angle is limited to take into account specific absorption rate (SAR) limitations.

9. The system as set forth in claim 1, wherein a maximum of said RF flip angle in said calculation of said RF flip angle is limited to avoid $B_1$ sensitivity effects.

10. The system as set forth in claim 1, further comprising an optimizer for optimizing for residual magnetization when blocks in said series of echoes are periodic with a known overall repetition rate.

11. A method of determining RF flip angles in a balanced steady-state free-precession transient imaging application, comprising:
    (a) having a balanced steady-state free-precession transient imaging device generating a series of echoes with for each of said echoes in said series of echoes generating a desired transverse magnetization profile $M_T$ and generating RF pulses whereby each of said RF pulses having a distinct RF flip angle for each of said echoes in said series of echoes; and
    (b) a computer coupled to said balanced steady state-free precession transient imaging device, wherein said computer is calculating the RF flip angle for each of said echoes such that the nth echo in said series of echoes uses as input a preceding magnetization $M(n-1)$ and the desired transverse magnetization $M_T(n)$ such that said desired transverse magnetization profile $M_T$ is achieved in said nth echo, wherein said balanced steady state-free precession transient imaging device is to apply said calculated RF flip angle in the generation of said nth echo.

12. The method as set forth in claim 11, wherein said preceding magnetization $M(n-1)$ comprises a preceding transverse magnetization $M_T(n-1)$, a preceding longitudinal magnetization $M_L(n-1)$ or a combination thereof.

13. The method as set forth in claim 11, wherein said RF flip angle calculation further uses as inputs a longitudinal relaxation constant, a transverse relaxation constant, and a time between RF pulses, wherein said longitudinal relaxation constant and said transverse relaxation constant are defined for one or more MRI species.

14. The method as set forth in claim 11, wherein said desired transverse magnetization profile $M_T$ is defined for one or more MRI species.

15. The method as set forth in claim 11, wherein said RF flip angle is calculated using an analytical inversion of the Bloch equation.

16. The method as set forth in claim 11, wherein said desired magnetization profile $M_T$ is a uniform desired transverse magnetization profile $M_T$, a windowed desired transverse magnetization profile $M_T$, or an arbitrary desired transverse magnetization profile $M_T$.

17. The method as set forth in claim 11, wherein said calculation of said RF flip angle is combined with a catalyzation process to minimize signal oscillations.

18. The method as set forth in claim 11, wherein a maximum of said RF flip angle in said calculation of said RF flip angle is limited to take into account SAR limitations.

19. The method as set forth in claim 11, wherein a maximum of said RF flip angle in said calculation of said RF flip angle is limited to avoid $B_1$ sensitivity effects.

20. The method as set forth in claim 11, further comprising an optimizer for optimizing for residual magnetization when blocks in said series of echoes are periodic with a known overall repetition rate.

* * * * *